(12) United States Patent
Sung

(10) Patent No.: US 8,395,318 B2
(45) Date of Patent: Mar. 12, 2013

(54) DIAMOND INSULATED CIRCUITS AND ASSOCIATED METHODS

(75) Inventor: Chien-Min Sung, Tansui (TW)

(73) Assignee: RiteDia Corporation, Hsin Chu Industrial Park (TW)

( * ) Notice: Subject to any disclaimer, the term of this patent is extended or adjusted under 35 U.S.C. 154(b) by 526 days.

(21) Appl. No.: 11/706,867

(22) Filed: Feb. 14, 2007

(65) Prior Publication Data

US 2012/0052279 A1     Mar. 1, 2012

(51) Int. Cl.
*H01J 1/62* (2006.01)

(52) U.S. Cl. .................................. 313/512; 313/498

(58) Field of Classification Search .................. 313/498, 313/506–512
See application file for complete search history.

(56) References Cited

U.S. PATENT DOCUMENTS

| | | | |
|---|---|---|---|
| 5,070,040 A | 12/1991 | Pankove | |
| 5,388,027 A | 2/1995 | Pollock et al. | |
| 5,391,914 A | 2/1995 | Sullivan et al. | |
| 5,412,160 A | 5/1995 | Yasumoto et al. | |
| 5,422,901 A | 6/1995 | Lebby et al. | |
| 5,682,063 A | 10/1997 | Yamamoto et al. | |
| 5,907,189 A | 5/1999 | Mertol | |
| 6,071,597 A | 6/2000 | Yang et al. | |
| 6,579,743 B2 | 6/2003 | Clevenger et al. | |
| 7,067,903 B2 | 6/2006 | Tachibana et al. | |
| 2004/0238946 A1* | 12/2004 | Tachibana et al. | 257/706 |
| 2005/0078151 A1* | 4/2005 | Bell et al. | 347/63 |
| 2005/0181122 A1* | 8/2005 | Hayashi et al. | 427/160 |
| 2005/0214949 A1* | 9/2005 | Hirano et al. | 436/161 |
| 2005/0253901 A1* | 11/2005 | Miller | 347/64 |
| 2005/0277216 A1* | 12/2005 | Asakawa | 438/22 |
| 2006/0014465 A1* | 1/2006 | Yamazaki | 445/24 |
| 2006/0017055 A1* | 1/2006 | Cropper et al. | 257/77 |

FOREIGN PATENT DOCUMENTS

| | | |
|---|---|---|
| EP | 1 610 375 A2 | 12/2005 |
| JP | 360128625 A | 7/1985 |

* cited by examiner

*Primary Examiner* — Joseph L Williams
(74) *Attorney, Agent, or Firm* — Thorpe North & Western LLP

(57) ABSTRACT

Methods and devices for cooling electronic circuits having at least one heat source are disclosed and described. One such thermally dynamic electronic device may include a layer of diamond material coated on a support substrate, and circuitry disposed on the layer of diamond material, the diamond material being configured to accelerate movement of heat away from the circuitry. Although the diamond material may be any known diamond material that functions to accelerate heat transfer, in one aspect the diamond material may be diamond-like carbon. In one specific aspect, the diamond-like carbon may be amorphous carbon. In another aspect, the diamond material may be crystalline diamond.

14 Claims, 1 Drawing Sheet

DIAMOND INSULATED CIRCUITS AND ASSOCIATED METHODS

FIELD OF THE INVENTION

The present invention relates generally to methods and associated devices for cooling electronic circuits. Accordingly, the present invention involves the electrical and material science fields.

BACKGROUND OF THE INVENTION

In many developed countries, major portions of the populations consider electronic devices to be integral to their lives. Such increasing use and dependence has generated a demand for electronics devices that are smaller and faster. As electronic circuitry increases in speed and decreases in size, cooling of such devices becomes problematic.

Electronic devices generally contain printed circuit boards having integrally connected electronic components that allow the overall functionality of the device. These electronic components, such as processors, transistors, resistors, capacitors, light-emitting diodes (LEDs), etc., generate significant amounts of heat. As it builds, heat can cause various thermal problems associated with both the printed circuit board and internally in many electronic components. Significant amounts of heat can affect the reliability of an electronic device, or even cause it to fail by, for example, causing burn out or shorting both within the electronic components themselves and across the surface of the printed circuit board. Thus, the buildup of heat can ultimately affect the functional life of the electronic device. This is particularly problematic for electronic components with high power and high current demands, as well as for the printed circuit boards that support them.

The prior art often employs fans, heat sinks, Peltier and liquid cooling devices, etc., as means of reducing heat buildup in electronic devices. As increased speed and power consumption cause increasing heat buildup, such cooling devices generally must increase in size to be effective and also require power in and of themselves to operate. For example, fans must be increased in size and speed to increase airflow, and heat sinks must be increased in size to increase heat capacity and surface area. The demand for smaller electronic devices, however, not only precludes increasing the size of such cooling devices, but may also require a significant size decrease.

As a result, methods and associated devices are being sought to provide adequate cooling of electronic devices while minimizing size and power constraints placed on such devices due to cooling.

SUMMARY OF THE INVENTION

Accordingly, the present invention provides a thermally dynamic electronic device, including a layer of diamond material coated on a support substrate, and circuitry disposed on the layer of diamond material, the diamond material being configured to accelerate movement of heat away from the circuitry. Although the diamond material may be any known diamond material that functions to accelerate heat transfer, in one aspect the diamond material may be diamond-like carbon. In one specific aspect, the diamond-like carbon may be amorphous carbon. In another aspect, the diamond material may be crystalline diamond.

Various materials are contemplated for the support substrate, and any material capable of supporting the diamond material layer and associated circuitry should be considered to be within the present scope. For example, in one aspect the support substrate may be a metal. In one specific aspect, the metal may be aluminum. In another aspect the support substrate may be a polymeric material. Nonlimiting examples of polymeric materials may include polyamines, polyacrylates, polyesters, polyamides, polyimides, polyurethanes, polyphenols, epoxies, isocyanates, polyisocyanurates, polysiloxanes, polyvinyls, polyethylenes, polypropylenes, polystyrenes, polysulfones, acrylonitrile-butadiene-styrene polymers, polyacrylics, polycarbonates, and mixtures thereof. One specific example of a polymeric material is an epoxy. In yet another aspect, the support substrate may be a semiconductor material. One specific example of a semiconductor material is silicon.

The present invention also provides methods of cooling an electronic device. Such a method may include coating a layer of diamond material on a support substrate, and depositing circuitry having a heat source on the diamond material such that heat movement is accelerated away from the heat source into the diamond material. Various methods of depositing circuitry onto the diamond material layer are contemplated. In one aspect, depositing circuitry may include depositing an uncured conductive paste on the diamond material, and curing the uncured conductive paste to form a cured conductive circuitry. In another aspect, depositing circuitry may include depositing a conductive material by a physical vapor deposition process. Such a deposition process may further include depositing a buffer layer on the diamond material, and depositing the conductive material on the buffer layer, wherein the buffer material improves adhesion between the diamond material and the conductive material. In one aspect, the buffer layer may form a carbide layer with the diamond material. Various buffer layers are contemplated to facilitate adhesion between the conductive material and the diamond material layer. For example, in one aspect the buffer layer may include chromium, titanium, tungsten, cobalt, molybdenum, tantalum, aluminum, nickel, zirconium, niobium, and combinations thereof.

Additionally, any conductive material is contemplated that can be utilized to form circuitry or circuit elements on a buffer layer or a diamond material layer. For example, in once aspect the conductive material may include copper, silver, gold, platinum, aluminum, titanium, tungsten, molybdenum, alloys, and combinations thereof. In a more specific aspect, the conductive material may include a member selected from the group consisting of copper, silver, gold, platinum, alloys, and combinations thereof.

The present invention also provides light-emitting diode devices having improved heat dissipation properties. Such a device may include, a layer of diamond material coated on a support substrate, and circuitry including a light emitting diode, where the circuitry is disposed on the layer of diamond material, and the diamond material is configured to accelerate movement of heat away from the circuitry.

There has thus been outlined, rather broadly, various features of the invention so that the detailed description thereof that follows may be better understood, and so that the present contribution to the art may be better appreciated. Other features of the present invention will become clearer from the following detailed description of the invention, taken with the accompanying claims, or may be learned by the practice of the invention.

DETAILED DESCRIPTION OF THE INVENTION

Definitions

Figure 1:
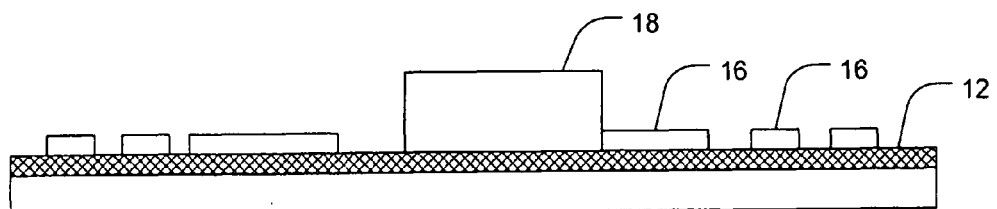
FIG. 1 is a cross-section view of an electronic circuit device in accordance with one embodiment of the present invention.

In describing and claiming the present invention, the following terminology will be used in accordance with the definitions set forth below.

The singular forms "a," "an," and, "the" include plural referents unless the context clearly dictates otherwise. Thus, for example, reference to "a heat source" includes reference to one or more of such sources, and reference to "the diamond layer" includes reference to one or more of such layers.

The terms "heat transfer," "heat movement," and "heat transmission" can be used interchangeably, and refer to the movement of heat from an area of higher temperature to an area of cooler temperature. It is intended that the movement of heat include any mechanism of heat transmission known to one skilled in the art, such as, without limitation, conductive, convective, radiative, etc.

As used herein, "dynamic" or "dynamically" or "thermally dynamic" refers to a characteristic of a material wherein the material is active at transferring energy. Generally, the dynamic material is active at transferring thermal energy.

As used herein, the terms "electrical circuitry" and "circuitry" can be used interchangeably, and are used to describe circuitry that includes both chip level circuitry and package level circuitry. It is intended that package level circuitry also include printed circuit board circuitry.

As used herein, "dielectric material" is used to describe any material having significant electrical insulating properties.

As used herein, "heat source" refers to a device or object having an amount of thermal energy or heat which is greater than an immediately adjacent region. In printed circuit boards, for example, a heat source can be any region of the board that is hotter than an adjacent region. Heat sources can include devices that produce heat as a byproduct of their operation (hereinafter known as "primary heat sources" or "active heat sources"), as well as objects that become heated by a transfer of heat energy thereto (hereinafter known as "secondary heat sources" or "passive heat sources"). Examples of primary or active heat sources include without limitation, CPU's, electrical traces, LED's, etc. Examples of secondary or passive heat sources include without limitation, heat spreaders, heat sinks, etc.

As used herein, the terms "conductive trace" and "conduction trace" refer to conductive pathways on a printed circuit board or other substrate that are capable of conducing heat, electricity, or both.

As used herein, "vapor deposited" refers to materials which are formed using vapor deposition techniques. "Vapor deposition" refers to a process of depositing materials on a substrate through the vapor phase. Vapor deposition processes can include any process such as, but not limited to, chemical vapor deposition (CVD) and physical vapor deposition (PVD). A wide variety of variations of each vapor deposition method can be performed by those skilled in the art. Examples of vapor deposition methods include hot filament CVD, rf-CVD, laser CVD (LCVD), laser ablation, conformal diamond coating processes, metal-organic CVD (MOCVD), sputtering, thermal evaporation PVD, ionized metal PVD (IMPVD), electron beam PVD (EBPVD), reactive PVD, and the like.

As used herein, "chemical vapor deposition," or "CVD" refers to any method of chemically depositing diamond particles in a vapor form upon a surface. Various CVD techniques are well known in the art.

As used herein, "physical vapor deposition," or "PVD" refers to any method of physically depositing diamond particles in a vapor form upon a surface. Various PVD techniques are well known in the art.

As used herein, "diamond" refers to a crystalline structure of carbon atoms bonded to other carbon atoms in a lattice of tetrahedral coordination known as $sp^3$ bonding. Specifically, each carbon atom is surrounded by and bonded to four other carbon atoms, each located on the tip of a regular tetrahedron. Further, the bond length between any two carbon atoms is 1.54 angstroms at ambient temperature conditions, and the angle between any two bonds is 109 degrees, 28 minutes, and 16 seconds although experimental results may vary slightly. The structure and nature of diamond, including its physical and electrical properties are well known in the art.

As used herein, "distorted tetrahedral coordination" refers to a tetrahedral bonding configuration of carbon atoms that is irregular, or has deviated from the normal tetrahedron configuration of diamond as described above. Such distortion generally results in lengthening of some bonds and shortening of others, as well as the variation of the bond angles between the bonds. Additionally, the distortion of the tetrahedron alters the characteristics and properties of the carbon to effectively lie between the characteristics of carbon bonded in $sp^3$ configuration (i.e. diamond) and carbon bonded in $sp^2$ configuration (i.e. graphite). One example of material having carbon atoms bonded in distorted tetrahedral bonding is amorphous diamond.

As used herein, "diamond-like carbon" refers to a carbonaceous material having carbon atoms as the majority element, with a substantial amount of such carbon atoms bonded in distorted tetrahedral coordination. Diamond-like carbon (DLC) can typically be formed by PVD processes, although CVD or other processes could be used such as vapor deposition processes. Notably, a variety of other elements can be included in the DLC material as either impurities, or as dopants, including without limitation, hydrogen, sulfur, phosphorous, boron, nitrogen, silicon, tungsten, etc.

As used herein, "amorphous diamond" refers to a type of diamond-like carbon having carbon atoms as the majority element, with a substantial amount of such carbon atoms bonded in distorted tetrahedral coordination. In one aspect, the amount of carbon in the amorphous diamond can be at least about 90%, with at least about 20% of such carbon being bonded in distorted tetrahedral coordination. Amorphous diamond also has a higher atomic density than that of diamond (176 atoms/$cm^3$). Further, amorphous diamond and diamond materials contract upon melting.

As used herein, "coat," "coating," and "coated," with respect to a substrate, refers to an area along at least a portion of an outer surface of the substrate that has been intimately contacted with a layer of heat conductive material, and, as such, thermal coupling has been achieved. In some aspects, the coating may be a layer which substantially covers an entire surface of the substrate. In other aspects, the coating may be a layer which covers only a portion of a surface of the substrate.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

The Invention

One promising material that may be used for heat dissipation devices is diamond. Diamond materials can transfer heat much faster than any other material. The thermal conductivity of diamond at room temperature (about 2000 W/mK) is five times higher than copper (about 400 W/mK) and eight times that of aluminum (250 W/mK), the two fastest metal heat conductors commonly used. Moreover, the thermal diffusivity of diamond (12.7 cm$^2$/sec) is eleven times that of copper (1.17 cm$^2$/sec) or aluminum (0.971 cm$^2$/sec). The ability for diamond to carry away heat without storing it makes diamond an ideal material for use in the dissipation of heat.

Aspects of the present invention utilize diamond materials to accelerate heat transfer away from hot spots associated with electronic circuits. By disposing circuitry on a layer of diamond material, heat may be accelerated away from the circuitry through the diamond material layer, spread laterally, and dissipated through transfer to underlying substrate materials. Many diamond materials, particularly diamond-like carbon, also accelerate heat transfer to the air. Thus electronic circuitry can be effectively cooled by accelerated heat transfer laterally through the diamond material layer and accelerated heat transfer to the air as heat spreads laterally. In addition to heat transfer benefits, the diamond material layer also functions to electrically isolate the circuitry due to the dielectric properties of diamond.

Any form of heat source known to introduce heat into electronic circuitry known to one skilled in the art is considered to be within the scope of the present invention. In one aspect the heat source can be an active heat source, and example of which may be a heat-generating electronic component. Such components may include, without limitation, resistors, capacitors, transistors, processing units including central and graphics processing units, LEDs, lazer diodes, filters, etc. Heat sources can also include regions of a printed circuit board or other electronic circuitry containing a high density of conductive traces, and regions receiving transmitted heated from a heat source that is not in physical contact with a printed circuit board. They can also include heat sources in physical contact with but not considered integral to a printed circuit board. An example of this may be a motherboard having a daughterboard coupled thereto, where heat is transferred from the daughterboard to the motherboard.

Irrespective of the source, the transfer of heat present in electronic circuitry can be accelerated away from the heat source through an underlying layer of a diamond material. It should be noted that the present invention is not limited as to specific theories of heat transmission. As such, the accelerated movement of heat away from the heat source can be at least partially due to heat movement laterally through the diamond material. Due to the heat conductive properties of diamond, heat can rapidly spread laterally through the diamond material layer. Additionally, the accelerated movement of heat away from the heat source may be at least partially due to heat movement from the diamond material to the air. Diamond materials, particularly diamond-like carbon has exceptional heat emissivity characteristics even at temperatures below 100° C., and as such, may radiate heat directly to the air. Many other materials, particularly varous resins, ceramics, and other materials that may be utilized as support structures, conduct heat much better than they emit heat. Due to the high heat conductive and radiative properties of diamond materials, heat movement from a diamond material layer to air can be greater than heat movement from other support materials to air. As such, a layer of diamond material can draw heat from the circuitry, and in some cases from support structures, and thus serve to accelerate heat transfer away from a heat source and into the air. Such accelerated heat transfer may result in electronic circuitry with much cooler operational temperatures.

The acceleration of heat transfer away from a heat source not only cools associated electronic circuitry, but may also function to cool electronic circuitry that is not directly associated with the diamond material layer by reducing the heat load on electronic components that are proximally located. For example, a central processing unit (CPU) having an external heat sink and fan may require less external cooling due to the improved heat transmission through the printed circuit board via the CPU socket.

Accordingly, in one aspect the present invention provides a thermally dynamic electronic device. As is shown in FIG. 1, such a device may include a layer of diamond material 12 coated on a support substrate 14, and circuitry 16, 18 disposed on the layer of diamond material 12, the diamond material 12 being configured to accelerate movement of heat away from the circuitry 16, 18. As has been described, it is intended that the term circuitry include any type of circuit element or electronic structure that can be incorporated into an electronic device. For example, in FIG. 1, 16 may represent conductive traces and 18 may represent an integrated circuit. It should be noted, however, that diamond material layer may be utilized according to various aspects of the present invention at both chip level circuitry and package level circuitry. It is intended that package level circuitry include printed circuit boards.

Figure 2:
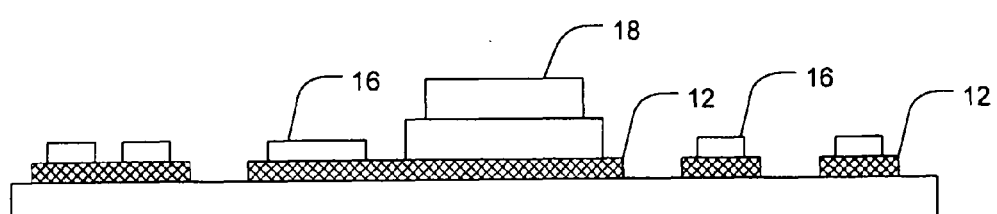
FIG. 2 is a cross-section view of an electronic circuit device in accordance with one embodiment of the present invention.
Figure 3:
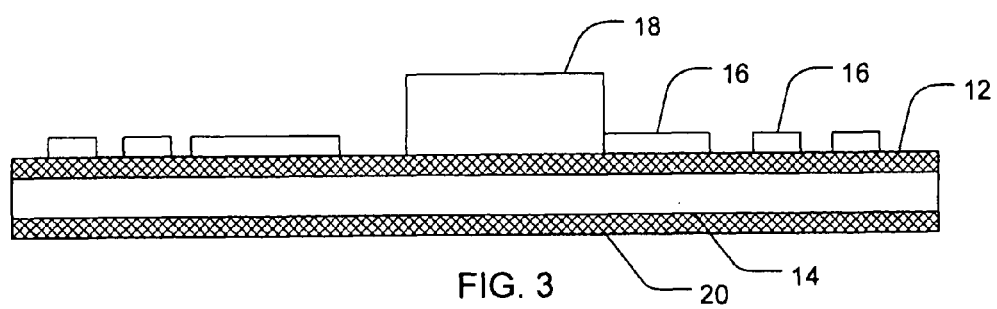
FIG. 3 is a cross-section view of an electronic circuit device in accordance with one embodiment of the present invention.

The portion of the support substrate coated with the diamond material layer may vary, depending on the type and intended use of the electronic circuit. In one aspect, for example, as is shown in FIG. 1, the diamond material layer 12 may be coated onto substantially all of a side of the support substrate 14 upon which circuitry 16, 18 will be deposited. As such, for some electronic circuit devices layers of diamond materials may be coated onto multiple surfaces of the support substrate that support circuitry. In another aspect, as is shown in FIG. 2, the diamond material layer 12 may be coated onto the support substrate 14 only on portions that support circuitry 16, 18. Alternatively, the diamond material layer may be coated onto the support substrate primarily in regions of hot spots in the circuitry (not shown). In yet another aspect, as is shown in FIG. 3, an additional diamond material layer 20 may be coated onto a surface of the support substrate 14 that lacks circuitry. In such cases, the additional diamond material layer may function to draw heat out of the support substrate for dissipation to the air.

It is also contemplated that, following deposition of the circuitry onto the layer of diamond material, a second layer of diamond material may further be deposited onto the circuitry. In this way, the circuitry is sandwiched between two diamond material layers, thus further increasing the proportion of circuitry that is in contact with diamond material, and thus further improving cooling. Further details regarding the deposition of diamond material layers onto circuitry can be found in copending U.S. application Ser. No. 11/201,771, filed on Aug. 10, 2005, and in the copending United States Application entitled "Methods and Devices for Cooling Electronic Circuitry," filed on Feb. 14, 2007, both of which are incorporated herein by reference.

The present invention also contemplates methods of cooling an electronic device, including coating a layer of diamond material on a support substrate, and depositing circuitry having at least one heat source on the diamond material such that heat movement is accelerated away from the heat source into the diamond material.

Numerous support substrates are contemplated, and the selection of a support substrate may vary depending on the type of circuitry being deposited and the intended use of the electronic device. It should be noted, however, that any suitable substrate capable of supporting a diamond material layer and associated circuitry should be considered to be within the scope of the present invention. In one aspect, for example, the support substrate may include, without limitation, semiconductor materials, metal materials, polymeric materials, and combinations thereof. Specific examples of semiconductor materials may include, without limitation, silicon, silicon carbide, silicon germanium, gallium arsenide, gallium nitride, germanium, zinc sulfide, gallium phosphide, gallium antimonide, gallium indium arsenide phosphide, aluminum phosphide, aluminum arsenide, aluminum gallium arsenide, gallium nitride, boron nitride, aluminum nitride, indium arsenide, indium phosphide, indium antimonide, indium nitride, and composites thereof. In another aspect the semiconductor materials may include, without limitation, silicon, silicon carbide, gallium arsenide, gallium nitride, gallium phosphide, aluminum nitride, indium nitride, indium gallium nitride, aluminum gallium nitride, or composites of these materials. In one specific aspect, the semiconductor material may be silicon. In another specific aspect, the semiconductor material may be silicon carbide. In some additional embodiments, non-silicon based support may include materials such as gallium arsenide, gallium nitride, germanium, boron nitride, aluminum nitride, indium-based materials, and composites thereof. In another aspect, the semiconductor material can comprise gallium nitride, indium gallium nitride, indium nitride, and combinations thereof. In one specific aspect, the semiconductor material is gallium nitride. In another specific aspect, the semiconductor material is aluminum nitride. Other semiconductor materials which can be used include $Al_2O_3$, BeO, W, Mo, $c\text{-}Y_2O_3$, $c\text{-}(Y_{0.9}La_{0.1})_2O_3$, $c\text{-}Al_{23}O_{27}N_5$, $c\text{-}MgAl_2O_4$, $t\text{-}MgF_2$, graphite, and mixtures thereof. It should be understood that the support may include any semiconductor material known, and should not be limited to those materials described herein. Additionally, semiconductor materials may be of any structural configuration known, for example, without limitation, cubic (zincblende or sphalerite), wurtzitic, rhombohedral, graphitic, turbostratic, pyrolytic, hexagonal, amorphous, or combinations thereof.

In another aspect, the support substrate may be a metal material. Metal materials may be useful in many situations because they are relatively easy to work with in many cases. Any metal material capable of functioning as a substrate according to the various aspects of the present invention should be considered to be within the present scope. One example of such a metal material is Al. Other nonlimiting examples may include tin, copper, stainless steel, etc.

When using many metal materials as support substrates, deposition of a diamond material layer thereon may be facilitated through the use of various carbides and carbide forming materials. Examples of carbide forming materials may include, without limitation, tungsten (W), tantalum (Ta), titanium (Ti), zirconium (Zr), chromium (Cr), molybdenum (Mo), silicon (Si), and manganese (Mn). Additionally, non-limiting examples of carbides include tungsten carbide (WC), silicon carbide (SiC), titanium carbide (TiC), zirconium carbide (ZrC), and mixtures thereof among others In yet another aspect, the support substrate may be a polymeric material. Nonlimiting examples of useful polymeric materials may include polyamines, polyacrylates, polyesters, polyamides, polyimides, polyurethanes, polyphenols, epoxies, isocyanates, polyisocyanurates, polysiloxanes, polyvinyls, polyethylenes, polypropylenes, polystyrenes, polysulfones, acrylonitrile-butadiene-styrene polymers, polyacrylics, polycarbonates, and mixtures thereof. In one specific aspect, the polymeric material may include epoxy.

As has been suggested, a variety of diamond materials may be utilized to transfer heat away from electronic circuitry. Any form of diamond material that could improve heat transfer would thus be considered to be within the scope of the present invention. For example, and without limitation, the diamond material may include diamond-like carbon, amorphous diamond, and crystalline diamond, including monocrystalline and polycrystalline diamond. Additionally, the diamond material layer may be of any thickness that functions to facilitate heat transfer away from the circuitry. In one specific aspect, however, the layer of diamond material may be from about 0.1 to about 100.0 microns thick. In another specific aspect, the layer of diamond material may be from about 0.1 to about 20.0 microns thick.

The diamond material layers discussed herein can be formed on a substrate using any number of known techniques. The most common vapor deposition techniques include chemical vapor deposition (CVD) and physical vapor deposition (PVD), although any similar method can be used if similar properties and results are obtained. In one aspect, CVD techniques such as hot filament, microwave plasma, oxyacetylene flame, rf-CVD, laser CVD (LCVD), metal-organic CVD (MOCVD), laser ablation, conformal diamond coating processes, and direct current arc techniques may be utilized. Typical CVD techniques use gas reactants to deposit the diamond or diamond-like material in a layer, or film. These gases generally include a small amount (i.e. less than about 5%) of a carbonaceous material, such as methane, diluted in hydrogen. A variety of specific CVD processes, including equipment and conditions, as well as those used for boron nitride layers, are well known to those skilled in the art. In another aspect, PVD techniques such as sputtering, thermal evaporation PVD, ionized metal PVD (IMPVD), electron beam PVD (EBPVD), and reactive PVD processes may be utilized. Additionally, it should be noted that specific deposition conditions may be used in order to adjust the exact type of material to be deposited, whether diamond-like carbon, amorphous diamond, or crystalline diamond.

In order to further increase heat transfer properties, in one aspect of the present invention the diamond material layer may be a conformal diamond material layer. Conformal diamond coating processes can provide a number of advantages over conventional diamond film processes. Conformal diamond coating can be performed on a wide variety of substrates, including non-planar substrates. A growth surface can be pretreated under diamond growth conditions in the absence of a bias to form a carbon film. The diamond growth conditions can be conditions which are conventional CVD deposition conditions for diamond without an applied bias. As a result, a thin carbon film is formed which is typically less than about 100 angstroms. The pretreatment step can be performed at almost any growth temperature such as from about 200° C. to about 900° C., although lower temperatures below about 500° C. may be preferred. Without being bound to any particular theory, the thin carbon film appears to form within a short time, e.g., less than one hour, and is a hydrogen terminated amorphous carbon. Following such pretreatment, the thin carbon film is subjected to diamond growth conditions to form the conformal diamond material layer. Diamond growth conditions can be those conditions which are commonly used in traditional CVD diamond growth. However, unlike conventional diamond film growth, the diamond film produced using the above pretreatment steps results in a conformal diamond film. Further, the diamond film typically begins growth substantially over the entire substrate with substantially no incubation time. In addition, a continuous film, e.g. substantially no grain boundaries, can develop within about 80 nm of growth.

Following the deposition of the layer of diamond material on the support substrate, the circuitry may be deposited thereon. It should be understood that various methods of depositing circuitry on a diamond material layer are possible, particularly considering the wide variety of circuitry and circuit elements that may be deposited. As such, any technique for such deposition should be considered to be within the present scope, and the following descriptions should not be seen as limiting.

In one aspect, circuitry may be deposited onto a diamond material layer by applying an uncured conductive paste onto the diamond material in a pattern representative of the desired circuitry, and curing the conductive paste to form cured conductive circuitry. The uncured conductive paste can be applied by any means known, however in one specific aspect the conductive paste may be applied via various screen printing techniques. Although any conductive paste may be utilized, specific nonlimiting examples may include copper paste, silver paste, gold paste, platinum paste, and combinations thereof. Upon heating such a paste, a conductive circuit may be formed on the diamond material layer. As an example, copper and silver pastes may be screen printed onto the diamond material layer and cured at a temperature of between about 150° C. and 200° C. for about 30 to about 60 minutes.

In another aspect, a conductive metal may be deposited directly onto the diamond material layer by a PVD process such as, without limitation, cathodic arc, sputtering, electron-beam evaporation, etc. Many conductive metals, however, do not adhere well to diamond surfaces. In such cases, a buffer layer may be applied to the diamond material to increase the adhesion of the PVD deposited circuitry. Although the selection of a buffer layer may vary depending on the type of diamond material and conductive metal utilized, in one aspect nonlimiting examples of buffer layers may include chromium, titanium, tungsten, cobalt, molybdenum, tantalum, aluminum, nickel, zirconium, niobium, and combinations thereof. In one specific aspect, diamond material may include diamond-like carbon, the conductive metal may be copper or silver, and the buffer layer may be chromium or titanium. Furthermore, in one aspect, the buffer layer may form a carbide layer on the diamond material that may improve the adhesion of the conductive metal deposited thereon. For example, chromium carbide or titanium carbide may improve the adhesion of copper or silver conductive metals on a diamond-like carbon layer. As an example, a buffer layer may be deposited using a high energy coating process having a bias greater than about 100 V to form a carbide layer between the buffer layer and the diamond material, followed by a lower energy coating process having a bias between about 50 to about 100 V to thicken the buffer layer to a desired thickness. Additionally, in some aspects the diamond material may be graded into the buffer layer to minimize abrupt crystal lattice transitions between the layers. For example, when depositing the diamond material layer, the proportion of atoms to deposit the buffer layer may be slowly increased to provide a gradual transition between the diamond material and the carbide buffer layer. Following deposition of the buffer layer, the conductive metal may be deposited onto the buffer layer.

It is also contemplated that the present invention includes aspects involving LED devices. As they have become increasingly important in electronics and lighting devices, LEDs continue to be developed that have ever increasing power requirements. This trend of increasing power has created cooling problems for these devices. These cooling problems can be exacerbated by the typically small size of these devices, which may render heat sinks with traditional aluminum heat fins ineffective due to their bulky nature. As an alternative, the inventors have discovered that integrating a diamond material layer into the LED package adequate cooling even at very high power, while maintaining a small LED package size.

Figure 4:
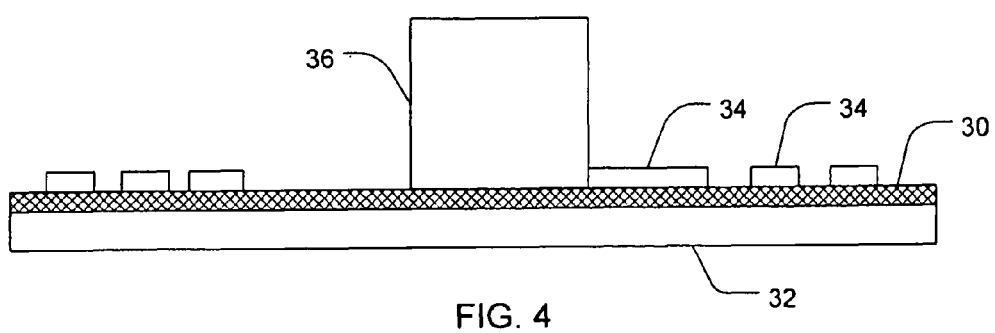
FIG. 4 is a cross-section view of an LED device in accordance with one embodiment of the present invention.

As such, as shown in FIG. 4, one aspect of the present invention may include an LED device having improved heat dissipation properties. The LED device may include a layer of diamond material 30 coated on a support substrate 32, and various circuitry 34 disposed on the diamond material layer 30. A light emitting diode 36 may be coupled to the diamond material layer 30 and electrically coupled to the circuitry 34. The diamond material layer 30 is thus configured to accelerate movement of heat away from the circuitry, and from the LED. Such a configuration thus allows an LED to operate at a cooler temperature than an LED package lacking a diamond material layer.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A thermally dynamic electronic device, comprising:
    a layer of diamond material coated on a support substrate, wherein the layer of diamond material is from about 0.5 to about 100.0 microns thick, and wherein the diamond material is diamond-like carbon; and
    circuitry disposed directly on the layer of diamond material, the diamond material being configured to accelerate movement of heat away from the circuitry.

2. The electronic device of claim 1, wherein the diamond-like carbon is amorphous carbon.

3. The electronic device of claim 1, wherein the layer of diamond material is from about 0.5 to about 20.0 microns thick.

4. The electronic device of claim 1, wherein the support substrate is a metal.

5. The electronic device of claim 4, wherein the metal is aluminum.

6. The electronic device of claim 1, wherein the support substrate is a polymeric material.

7. The electronic device of claim 6, wherein the polymeric material is a member selected from the group consisting of polyamines, polyacrylates, polyesters, polyamides, polyimides, polyurethanes, polyphenols, epoxies, isocyanates, polyisocyanurates, polysiloxanes, polyvinyls, polyethylenes, polypropylenes, polystyrenes, polysulfones, acrylonitrile-butadiene-styrene polymers, polyacrylics, polycarbonates, and mixtures thereof.

8. The electronic device of claim 7, wherein the polymeric material is an epoxy.

9. The electronic device of claim 1, wherein the support substrate is a semiconductor material.

10. The electronic device of claim 9, wherein the semiconductor material is Si.

11. The electronic device of claim 1, wherein the circuitry includes at least one conductive trace.

12. The electronic device of claim 1, wherein the circuitry includes a chip level circuit.

13. The electronic device of claim 1, further including an additional layer of diamond material coated on the circuitry, such that the circuitry is located between the layer of diamond material and the additional layer of diamond material.

14. A light-emitting diode device having improved heat dissipation properties, comprising:
    a layer of diamond material coated on a support substrate, wherein the layer of diamond material is from about 0.5 to about 100.0 microns thick, wherein the diamond material is diamond-like carbon; and
    circuitry including a light emitting diode, said circuitry being disposed directly on the layer of diamond material, and said diamond material being configured to accelerate movement of heat away from the circuitry.

* * * * *